United States Patent [19]

Nishio

[11] Patent Number: 4,897,614

[45] Date of Patent: Jan. 30, 1990

[54] CURRENT MIRROR CIRCUIT

[75] Inventor: Koji Nishio, Mitaka, Japan

[73] Assignee: Kabushiki Kaisha Toshiba, Kanagawa, Japan

[21] Appl. No.: 218,799

[22] Filed: Jul. 14, 1988

[30] Foreign Application Priority Data

Jul. 17, 1987 [JP] Japan ................................ 62-177274

[51] Int. Cl.[4] ................................................ H03F 3/45

[52] U.S. Cl. .................................... 330/257; 323/316; 330/288

[58] Field of Search ........................ 330/255, 257, 288; 323/315, 316

[56] References Cited

U.S. PATENT DOCUMENTS 3,995,229 11/1976 Stehlin et al. ................... 330/257 X

FOREIGN PATENT DOCUMENTS 33717 2/1985 Japan .................................. 330/288

21309 1/1987 Japan .................................. 330/288

*Primary Examiner*—James B. Mullins

*Attorney, Agent, or Firm*—Finnegan, Henderson, Farabow, Garrett, & Dunner

[57] ABSTRACT

A current mirror circuit comprises first, second and third transistors of same conductivity type. The emitter electrodes of the first and second transistors are connected to the power source terminal, and the base electrodes thereof are connected in common. An input current is supplied to the collector electrode of the first transistor. The emitter electrode of the third transistor is connected to the common connection of the first and the second transistors, and the base electrode thereof is connected to the collector electrode of the first transistor. A resistor is connected between the base and the collector electrodes of the first transistor.

7 Claims, 3 Drawing Sheets

CURRENT MIRROR CIRCUIT

BACKGROUND OF THE INVENTION

1. Field of the Invention

This invention concerns a current mirror circuit. More particularly, this invention concerns a current mirror circuit which is operative at a relatively low power source voltage.

2. Description of the Prior Art

A current mirror circuit is widely used as a basic circuit, such as a constant current source for a bias circuit, or as a current distribution circuit in an analog circuit, as well as an amplifier circuit.

FIG. 1A and FIG. 1B are circuit diagrams of basic current mirror circuits.

In FIG. 1A, the emitter electrodes of PNP transistors Q1 and Q2 are connected to a power source terminal Vcc, and the base electrodes thereof are connected in common. The common connection of the base electrodes of the transistors Q1 and Q2 is connected to a ground terminal GND through an input current source 1. The collector electrode of the transistor Q2 is connected to the GND terminal.

In this circuit, when the transistors Q1 and Q2 have same geometric dimension, the collector current Is of the transistor Q2 is equal to the input current Iref, assuming that the base currents of the transistor Q1 and Q2 are negligible with respect to the collector currents of the transistors Q1 and Q2. This current mirror circuit is operative at a power source voltage which is higher than the base-emitter voltage VF of the transistors Q1 and Q2.

However, in this circuit, as the base currents of the transistors Q1 and Q2 are added to the collector current of the transistor Q1, this causes an error in the current mirror ratio between the input current Iref and the collector current Is of the transistor Q2. Namely, the relationship between the input current Iref and the output current Is is expressed as follows:

$$Is = Iref/(1 + 2/h_{FE}) \quad (1)$$

wherein $h_{FE}$ is the current gain of the transistors Q1 and Q2. Assuming that the $h_{FE}$ is 10, the output curent Is is approximately about 0.83.Iref from equation (1). This error is notable when the current gains of the transistors Q1 and Q2 are low. Thus, the collector current Is of the transistor Q2 decreases compared with the input current Iref, as shown in FIG. 2 as a dotted line, when the current gain is low.

In FIG. 1B, NPN transistors are used instead of the PNP transistors in the circuit of FIG. 1A. The common base connection of the transistors Q3 and Q4 is connected to the collector electrode of the transistor Q3 in the same way as in FIG. 1A. Thus, the same problem exists in this circuit.

To solve the above problem, improved current mirror circuits as shown in FIGS. 3A and 3B have been used.

In the circuit of FIG. 3A, a compensating transistor Q5 of PNP type is provided. Namely, the emitter electrode of the transistor Q5 is connected to the common connection of the base electrodes of the transistors Q1 and Q2. The base electrode of the transistor Q5 is connected to the collector electrode of the transistor Q1, and the collector electrode thereof is connected to the GND terminal.

In this circuit, the current to be added to the collector current of the transistor Q1 is reduced to $1/h_{FE}$ of the base currents of the transistors Q1 and Q2 ($h_{FE}$ is the current gain of the transistor Q5). The relationship between the output current Is and the input current Iref can be expressed as follows:

$$Is \approx \frac{Iref}{1 + \frac{2}{h_{FE}^2}} \quad (2)$$

Assuming that the $h_{FE}$ is 10, the Is is approximately 0.98.Iref. Thus, the error of the current mirror ratio due to the base current is improved.

In the same way, the current mirror circuit of FIG. 3B is provided with a compensating transistor Q6 of NPN type to improve the current mirror ratio thereof.

However, in these current mirror circuits, it is necessary to increase the power source voltage higher than 2 VF to operate the circuits. Thus, the minimum power source voltage to operate the current mirror circuit is increased to 2 VF as shown in FIG. 4.

SUMMARY OF THE INVENTION

Therefore, an object of this invention is to provide a current mirror circuit having a smaller error of the current mirror ratio, and which operates at a relatively low power source voltage.

To achieve the object, this invention provides a current mirror circuit which comprises: first and second power source terminals; first transistor means for receiving an input current, having an emitter electrode, a base electrode and a collector electrode; second transistor means for outputting an output current, having an emitter electrode, a base electrode and a collector electrode; means for connecting the emitter electrodes of said first and second transistor means to the first power source terminal; resistor means for connecting the base electrode of the first transistor means to the collector electrode thereof; third transistor means for supplying a predetermined current to the base electrodes of the first and second transistor means when the voltage drop across the resistor means exceeds a predetermined value; and means for supplying the input current to the collector electrode of the first transistor means.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings.

DETAILED DESCRIPTION OF THE INVENTION

Figure 1A:
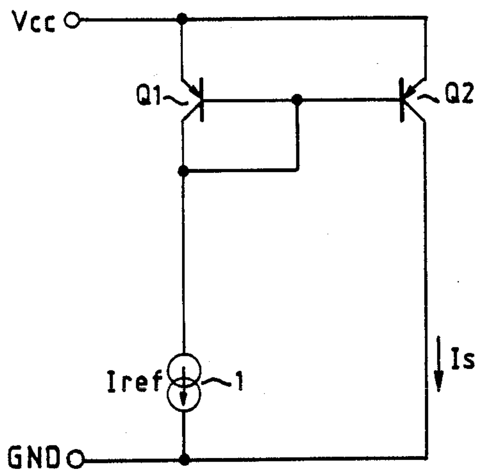
FIG.1A. PRIOR ART
FIG. 1A and FIG. 1B are circuit diagrams of conventional current mirror circuits.
Figure 1B:
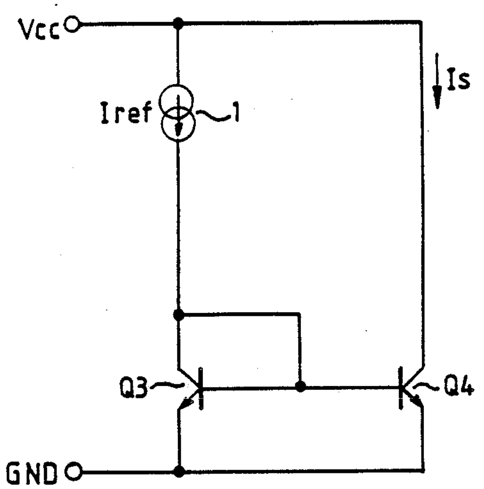
FIG.1B. PRIOR ART
Figure 2:
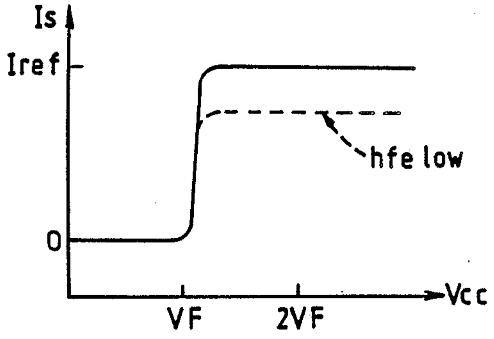
FIG 2 PRIOR ART
FIG. 2 is a diagram showing characteristics of the prior art.
Figure 3A:
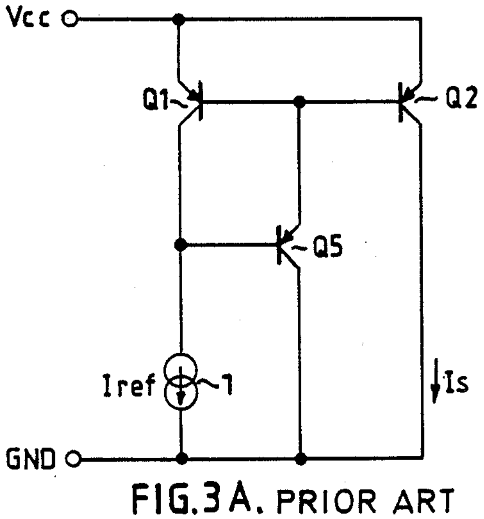
FIG.3A. PRIOR ART
FIG. 3A and FIG. 3B are circuit diagrams of other conventional current mirror circuits.
Figure 3B:
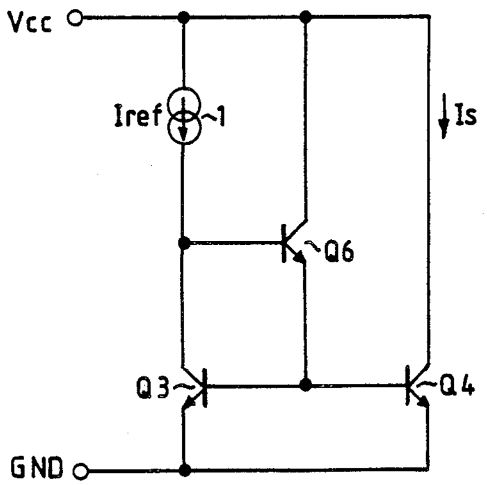
FIG.3B. PRIOR ART
Figure 4:
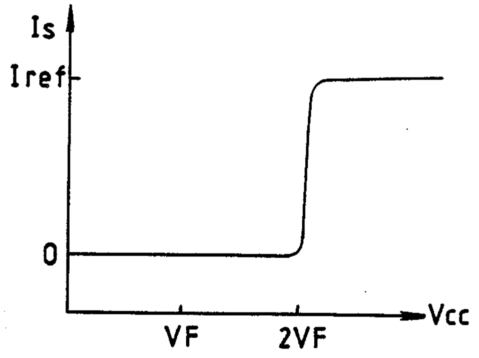
FIG. 4. PRIOR ART
FIG. 4 is a diagram showing the characteristics of the prior art of FIG. 3A and FIG. 3B.
Figure 5A:
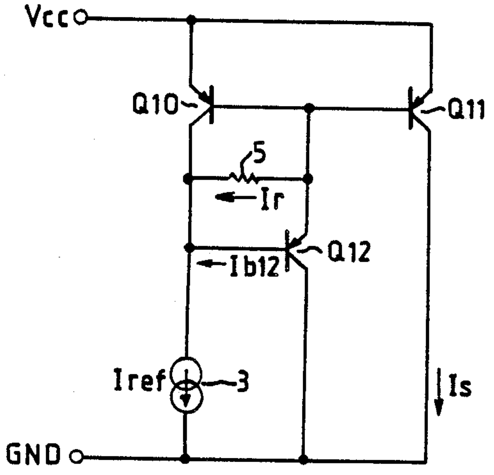
FIG. 5A and FIG. 5B are circuit diagrams of current mirror circuits of this invention.

FIG. 5A is a circuit diagram of current mirror circuit of this invention. In FIG. 5A, the emitter electrodes of the PNP transistors Q10 and Q11 are connected to the power source terminal Vcc. The base electrodes of the transistors Q10 and Q12 are connected in common. The collector electrode of the transistor Q10 is connected to the GND terminal through an input current source 3. The emitter electrode of a base compensating transistor Q12 of PNP type is connected to the common connection of the base electrodes of the transistors Q10 and Q11. The base electrode of the transistor Q12 is connected to the collector electrode of the transistor Q10, and the collector electrode of the transistor Q12 is connected to the GND terminal. A resistor 5 is connected between the base and the collector electrodes of the transistor Q10.

In this circuit, when the power source voltage Vcc is below VF (VF corresponds to the base to emitter voltage of the transistors Q10, Q11 and Q12), no transistor is in a conductive state. When the power source voltage Vcc exceeds VF, assuming the voltage drop at the input current source 3 is negligible, a base current is supplied to the common connection of the base electrode of the transistors Q10 and Q11 through the resistor 5. Thus, the transistors Q10 and Q11 change into a conductive state. This circuit is operative when the following relationship is satisfied:

$$2Ib \cdot R < Vcc - VF \quad (3)$$

wherein Ib is the base current of the transistors Q10 and Q11, and R is the resistance value of the resistor 5. Therefore, even if the power source voltage Vcc is below 2.VF, this circuit is operative as a current mirror circuit.

When the power source voltage Vcc increases, and the voltage drop at the resistor 5 exceeds VF, the transistor Q12 changes into a conductive state. In this state, the current Ir which flows through the resistor 5 and the base current Ib12 of the transistor Q12 cause the error in the current mirror ratio. As the voltage drop at the resistor 5 is limited to VF (the base to emitter voltage of the transistor Q12) by the transistor Q12, even if the power source voltage is increased, a current to be added to the collector current of the transistor Q12 through the resistor 5 is limited. In the case where the resistance value of the resistor 5 is 30 KΩ, the current Ir which flows through the resistor 5 is limited to about 0.002 mA when the compensating transistor Q12 is in a conductive state. Thus, if the Iref is 1 mA, the current Ir is negligible with respect to the Iref. On the other hand, the relationship between the Ir, Ib12 and the base current Ib of the transistor Q10 and Q11 is expressed as follows:

$$h_{FE}12 \cdot Ib12 + Ir = 2Ib \quad (4)$$

thus, $$\begin{aligned} Ib12 &= (2Ib - Ir)/h_{FE} \\ &\simeq 2Is/h_{FE}^2 - Ir/h_{FE} \end{aligned} \quad (5)$$

wherein $h_{FE}12$ is the current gain of the transistor Q12. As apparent from the equation (5), the base current of the transistor Q12 is also very small. Thus, a current mirror circuit, having an improved current mirror ratio, and being operative at a relatively low power source voltage, is achieved.

Figure 5B:
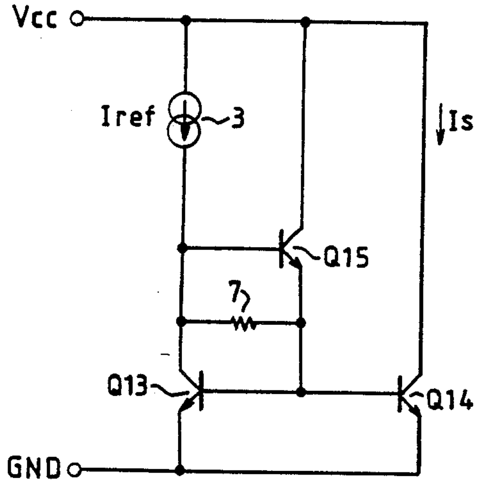

In FIG. 5B, NPN type transistors are used instead of the PNP transistors. Namely, in this circuit, the emitter electrodes of the NPN transistors Q13 and Q14 are connected to the GND terminal, and their base electrodes are connected in common. The collector electrode of the transistor Q13 is connected to the power source terminal Vcc through an input current source 3. The emitter electrode of the compensating transistor Q15 is connected to the common connection of the base electrodes of the transistors Q13 and Q14. The base electrode of the transistor Q15 is connected to the collector electrode of the transistor Q13, and the collector electrode thereof is connected to the power source terminal Vcc.

This circuit operates in the same way as the circuit of FIG. 5A. Namely, when the power source voltage Vcc is below VF, no transistor is in a conductive state. When Vcc exceeds VF of the transistor Q13, assuming that the voltage drop at the input current source 3 is negligible, a base current is supplied to the base electrodes of the transistors Q13 and Q14 through the resistor 7. Thus, the transistors Q13 and Q14 change into a conductive state. When Vcc increases, and the voltage drop at the resistor 7 exceeds VF, the transistor Q15 changes into a conductive state to compensate for the current mirror rate dispersion based on the base currents of the transistors Q13 and Q14.

Figure 6:
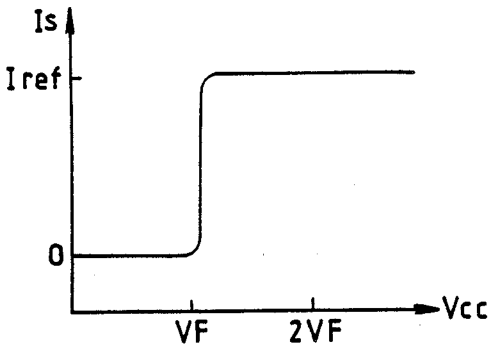
FIG. 6 is a diagram showing the characteristics of the embodiment of FIGS. 5A and 5B.

The FIG. 6 shows the characteristic of the current mirror circuit of FIGS. 5A and 5B. As shown in the diagram, the current mirror circuit of this invention is operative at a low power source voltage, namely VF. Furthermore, the compensating transistor operates when the power source voltage exceeds 2 VF to compensate for the dispersion of the current mirror rate due to the base current. Thus the current mirror rate is improved.

Figure 7:
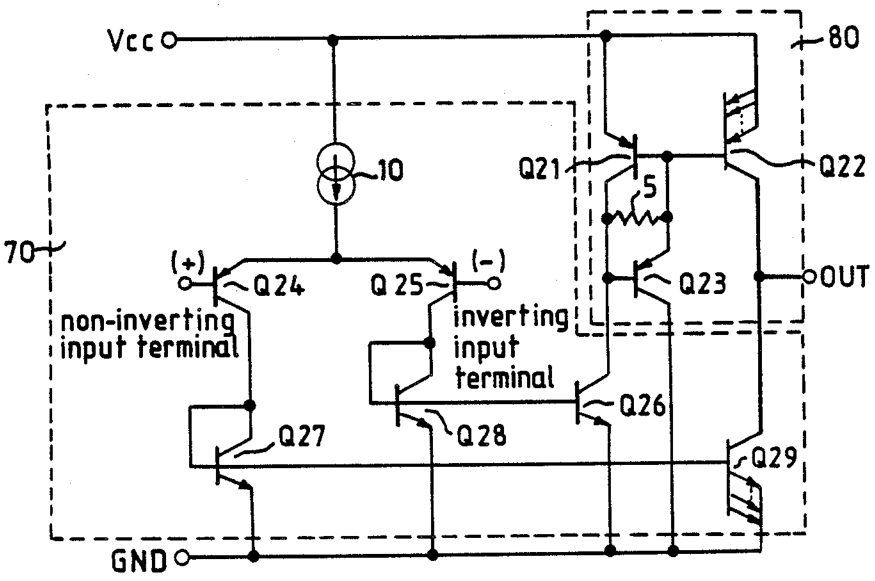
FIG. 7 is a circuit diagram of an amplifier circuit provided with the improved current mirror circuit of this invention.

FIG. 7 is a circuit diagram of an amplifier circuit which is provided with an improved current mirror circuit of this invention. In this circuit, the numeral 70 designates a differential amplifier section, and the numeral 80 designates a current mirror circuit. In this circuit, the current mirror circuit 80 functions as an output circuit of the amplifier circuit.

The differential amplifier section 70 includes a pair of PNP type input transistors Q24 and Q25. The base electrodes of the transistors Q24 and Q25 are connected to the non-inverting input terminal (+) and the inverting input terminal (−), respectively. The emitter electrodes of the transistors Q24 and Q25 are connected to the power source terminal Vcc through a current source 10. The collector electrode of the transistor Q24 is connected to the GND terminal through a diode-connected transistor Q27. Namely, the collector electrode and the base electrode of the transistor Q27 are connected in common, and are connected to the collector electrode of the transistor Q24. The emitter electrode of the transistor Q27 is connected to the GND terminal. The collector electrode of the transistor Q25 is connected to the GND terminal through a diode-connected transistor Q28. Namely, the base and the collector electrodes of the transistor Q28 are connected in common, and are connected to the collector electrode of the transistor Q25. The emitter electrode of the transistor Q26 is connected to the GND terminal, and the base electrode thereof is connected to the base electrode of the transistor Q28 to form a current mirror circuit. The emitter electrode of a transistor Q29 is connected to the GND terminal, and the base electrode thereof is connected to the base electrode of the transistor Q27 to form a current mirror circuit. The geometric dimension of the transistor Q29 is N times larger than that of the transistor Q27. Thus, the collector current of the transistor Q29 is N times larger than that of the transistor Q27.

The numeral 80 designates an improved current mirror circuit of this invention. The current mirror circuit 80 includes PNP type transistors Q21, Q22 and Q23 and a resistor 5. The emitter electrodes of the transistors Q21 and Q22 are connected to the power source terminal Vcc, and the base electrodes of the transistors Q21 and Q22 are connected in common. The geometric dimension of the emitter area of the transistor Q22 is N times larger than that of the transistor Q21. Thus, the collector current of the transistor Q22 is N times larger than that of the transistor Q21. The collector electrode of the transistor Q21 is connected to the collector electrode of the transistor Q26. The collector electrode of the transistor Q22 is connected to the output terminal OUT and the collector electrode of the transistor Q29.

In this circuit, when the potential at the inverting input terminal (−) is lower than that of the non-inverting input terminal (+), the transistors Q25, Q28, Q26, Q21, Q22 and Q23 change into the conductive state. Thus, an output current is supplied from the output terminal OUT. On the other hand, when the potential at the non-inverting input terminal (+) is lower than that of the inverting input terminal (−), the transistors Q24, Q27 and Q29 change into conductive state, to absorb an output current from the output terminal OUT.

As the improved current mirror circuit of this invention is operative at a relatively low power source voltage, about 0.9 (v), it is possible to provide an amplifier circuit which is operative at a low power source voltage. Furthermore, the common connection of the collector electrodes of the transistors Q22 and Q29 is connected to the output terminal OUT, and the dynamic range of the output voltage is wide. Namely, the maximum output voltage Vmax, and the minimum output voltage Vmin are expressed as follows:

$$Vmax = Vcc - Vces22 \quad (6)$$

$$Vmin = Vces29 \quad (7)$$

wherein Vces22 and Vces29 are the collector-emitter voltages of the transistors Q22 and Q29 at the saturation state. Since, this amplifier circuit is operative at a low power source voltage over a wide dynamic range, this circuit is preferable as an amplifier circuit in a speech network where a low power voltage operation is required, and where the input current depends on the power source voltage, such as a telephone circuit.

The present invention has been described with respect to a specific embodiment. However, other embodiments based on the principles of the present invention should be obvious to those of ordinary skill in the art. Such embodiments are intended to be covered by the claims.

What is claimed is:

1. A current mirror circuit comprising:
- first and second power source terminals;
- first transistor means for receiving an input current, having an emitter electrode, a base electrode and a collector electrode;
- second transistor means for outputting an output current, having an emitter electrode, a base electrode and a collector electrode;
- means for connecting the emitter electrodes of said first and second transistor means to the first power source terminal;
- resistor means for connecting the base electrode of the first transistor means to the collector electrode thereof and for supplying current to the base electrodes of the first and second transmitter means to make the first and second transistor means conductive initially;
- third transistor means for supplying a predetermined current to the base electrodes of the first and second transistor means when the voltage drop across the resistor means exceeds a predetermined value to increase the current to the base electrodes of the first and second transistor means; and
- means for supplying the input current to the collector electrode of the first transistor means.

2. The current mirror circuit of claim 1, wherein the first, the second and the third transistor means each include a PNP type transistor.

3. The current mirror circuit of claim 1, wherein the first, the second and the third transistor means each include an NPN type transistor.

4. The current mirror circuit of claim 1, wherein the second transistor means has a larger emitter area than that of the first transistor means.

5. An amplifier circuit for amplifying an input signal, and for outputting an amplified output signal, comprising:
- first and second power source terminals;
- input terminal means for receiving the input signal;
- output terminal means for outputting the output signal;
- transistor circuit means for generating an input current in response to the input signal;
- a current mirror circuit including:
  - first transistor means for receiving the input current, having an emitter electrode, a base electrode and a collector electrode,
  - means for connecting the collector electrode of the first transistor means to the transistor circuit means,
  - second transistor means for outputting the output current, having an emitter electrode, a base electrode and a collector electrode,
  - means for connecting the emitter electrodes of said first and second transistor means to the first power source terminal,
  - means for connecting the collector electrode of the second transistor means to the output terminal means,
  - resistor means for connecting the base electrode of the first transistor means to the collector electrode thereof and for supplying current to the base electrodes of the first and second transistor means to make the first and second transistor means conductive initially, third transistor means for supplying a predetermined current to the base electrodes of the first and second transistor means when the voltage drop across the resistor means exceeds a predetermined value to increase the current of the base electrodes of the first and second transistor means.

6. The amplifier circuit of claim 5, wherein the input terminal means comprises first and second input terminals.

7. The amplifier circuit of claim 6, wherein the transistor circuit means comprises;

first and second input transistors of a first conductivity type, each having an emitter electrode, a base electrode and a collector electrode;

means for connecting the base electrodes of the first and second input transistors to the first and second input terminals, respectively;

means for supplying a bias current to the emitter electrodes of the first and second input transistors;

a third transistor of a second conductivity type, having a collector electrode connected to the collector electrode of the first input transistor, a base electrode connected to the collector electrode thereof, and an emitter electrode connected to the second power terminal;

a fourth transistor of the second conductivity type, having a collector electrode connected to the collector electrode of the second input transistor, a base electrode connected to the collector electrode thereof, and an emitter electrode connected to the second power terminal;

a fifth transistor of the second conductivity type, having a base electrode connected to the base electrode of the fourth transistor, an emitter electrode connected to the second power source electrode and a collector electrode connected to the collector electrode of the first transistor means;

a sixth transistor of the second conductivity type, having a base electrode connected to the base electrode of the third transistor, an emitter electrode connected to the second power source terminal and a collector electrode connected to the collector electrode of the second transistor means.

* * * * *